United States Patent [19]

Hechtman

[11] Patent Number: 4,704,550

[45] Date of Patent: Nov. 3, 1987

[54] METHOD AND APPARATUS FOR DRIVING ELECTRICAL CIRCUITS

[75] Inventor: Charles D. Hechtman, Hopewell Township, Mercer County, N.J.

[73] Assignee: American Telephone and Telegraph Company, New York, N.Y.

[21] Appl. No.: 928,082

[22] Filed: Nov. 7, 1986

[51] Int. Cl.[4] .................. H03K 17/04; H03K 17/687
[52] U.S. Cl. ...................................... 307/571; 307/270;
307/296 A; 307/353; 307/497; 307/570;
307/575; 307/246; 324/158 R
[58] Field of Search .......................... 324/158 R, 73 R;
307/200 B, 494, 495–497, 352–353, 240, 246,
570–575, 577, 581, 584, 260, 296 R, 473, 475,
296 A, 270; 330/9; 371/15

[56] References Cited

U.S. PATENT DOCUMENTS

| | | | |
|---|---|---|---|
| 3,673,438 | 6/1972 | Lund et al. | 307/270 |
| 4,000,410 | 12/1976 | Hentschel et al. | 324/158 R |
| 4,280,065 | 7/1981 | Minato et al. | 307/473 |
| 4,313,065 | 1/1982 | Yoshida et al. | 307/570 X |
| 4,316,243 | 2/1982 | Archer | 307/570 X |
| 4,341,963 | 7/1982 | Jensen et al. | 307/497 |
| 4,399,405 | 8/1983 | Welzhofer | 324/73 R |
| 4,465,945 | 8/1984 | Yin | 307/473 |
| 4,472,678 | 9/1984 | Lauriello | 324/73 R |
| 4,491,750 | 1/1985 | Janutka | 307/570 X |
| 4,527,081 | 7/1985 | Stewart | 307/571 X |
| 4,567,378 | 1/1986 | Raver | 307/571 X |
| 4,588,950 | 5/1986 | Henley | 324/158 R |
| 4,607,214 | 8/1986 | Welzhofer | 324/158 R |

OTHER PUBLICATIONS

Harrod, "Shunting Technique for Testing Electronic Circuitry", IBM T.D.B., vol. 18, No. 1, Jun. 1975, pp. 204–205.

Primary Examiner—Stanley D. Miller
Assistant Examiner—D. R. Hudspeth
Attorney, Agent, or Firm—Robert B. Levy

[57] ABSTRACT

A driver circuit (10) for sourcing current to, and sinking current from, a load (12) comprises a pair of field effect transistors (18,20) each having their gate-to-source portion coupled between the load and one of a pair of voltage sources which serve to sink and source current, respectively. First and second bias networks (48,119) are each coupled to the gate and source of each of the field effect transistors, respectively. First and second junction transistors (42 and 100) are each coupled between a separate one of the first and second bias networks (48 and 119), respectively, and a current source (64) to provide a conductive path therebetween. The first junction transistor is rendered conductive to pass current to the first bias network so that a voltage of sufficient magnitude appears between the source and gate of the first field effect transistor to prevent the conduction thereof. The second junction transistor is rendered conductive alternately with the first junction transistor to divert current away from the first bias network and into the second bias network to render the second field effect transistor substantially non-conductive.

15 Claims, 1 Drawing Figure

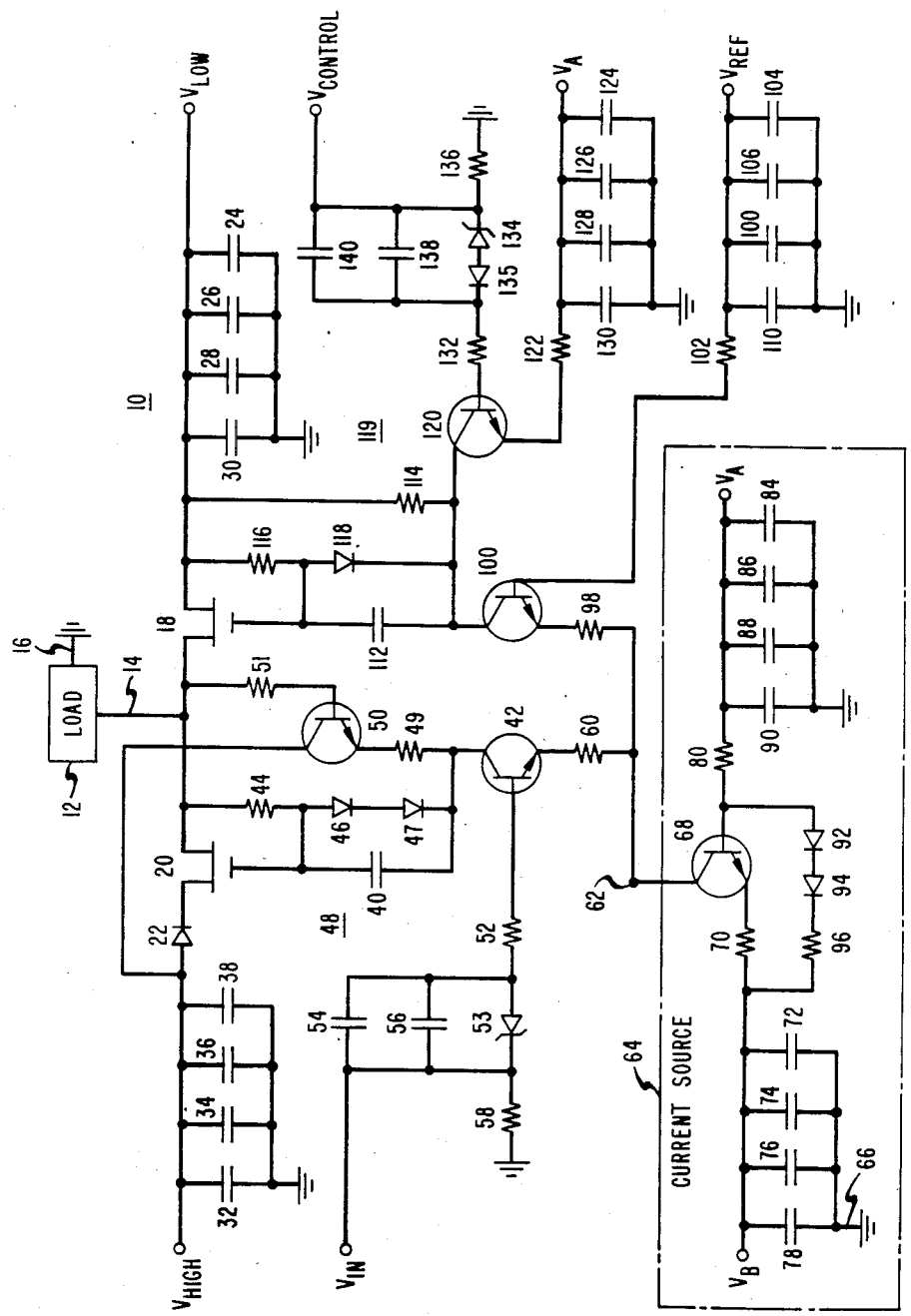

METHOD AND APPARATUS FOR DRIVING ELECTRICAL CIRCUITS

TECHNICAL FIELD

This invention relates to a method and apparatus for sourcing current to or sinking current from a load and for selectively presenting a high impedance thereto.

BACKGROUND ART

Most electronic equipment produced today is comprised of one or more printed circuit boards each populated with different types of electronic components interconnected to each other to form one or more functional circuits. Once populated with components, the printed circuit board is subjected to in-circuit testing. In this way, the operation of the functional circuits contained on the circuit board can be verified. During in-circuit testing of printed circuit boards containing digital components, such as logic gates and memory devices, it is often desirable to isolate and test individual components. However, the component being tested often receives input signals from one or more other components. Isolation of the component under test can be accomplished by back driving those devices supplying input signals thereto. Back driving of a device is accomplished by either sourcing current to, or sinking current from, the output thereof so that the signal supplied therefrom to the component under test does not vary. In some instances, current must be alternately sourced to, and sunk from, the device to isolate the component under test therefrom. In practice, commercially available testing machines for achieving in-circuit testing of digital circuits are provided with driver circuits for alternately sourcing and sinking current to permit devices on the circuit board to be back driven.

Presently, many digital components are capable of operating at very high frequencies, often as high as 100 MHz or higher. To reliably test such components at their operating frequency, those devices supplying input signals thereto must be back driven at the same frequency. In practice, the driver circuits within conventional testing machines are only capable of back driving devices at frequencies of no greater than 10 MHz. Thus, many digital components cannot be reliably tested at their operating frequency. Accordingly, there is a need for a method of alternately sourcing current to, and sinking current from, a load at very high frequencies.

BRIEF SUMMARY OF THE INVENTION

Briefly, the foregoing problem has been overcome by the method of the present invention for sourcing current to, and sinking current from, a load. The method includes the step of supplying current from a current source to a first bias network to cause a voltage of a predetermined magnitude to appear thereacross. The voltage developed across the first bias network is supplied to the gate of a first high-frequency field effect transistor coupled between the load and one of a pair of voltage sources which serve to source and sink current, respectively. While the voltage supplied from the first bias network to the first field effect transistor remains at the predetermined magnitude, the field effect transistor remains substantially non-conductive. Substantially all the current produced by the current source may be selectively diverted from the first bias network into a second bias network. As a result, a voltage of a predetermined magnitude appears across the second bias network while at the same time substantially no voltage appears across said first bias network. With no voltage across the first bias network, the first field effect transistor becomes conductive. The voltage appearing across the second bias network is supplied to the gate of a second high-frequency field effect transistor coupled between the load and the second of the pair of voltage sources. While the voltage across the second bias network remains at the predetermined magnitude, the second field effect transistor remains substantially non-conductive intervals said first field effect transistor is conductive.

BRIEF DESCRIPTION OF THE DRAWING

The FIGURE is a schematic view of the driver circuit of the present invention.

DETAILED DESCRIPTION

The FIGURE is a schematic diagram of a driver circuit 10, constructed in accordance with the present invention, for sourcing current to, and sinking current from, a load 12 having a pair of terminals 14 and 16. In practice, the load 12 typically takes the form of a digital device (i.e., a gate or a memory) which produces either a logic "high" or a logic "low" signal at terminal 14 thereof (with respect to ground) for transmission to a component under test (not shown). The logic "high" and "low" signals typically correspond to a dc voltage of +5 and zero volts, respectively. The driver circuit 10 comprises a pair of field effect transistors (FETs) 18 and 20 which, in the exemplary embodiment, are selected to operate at speeds well in excess of 100 MHz. The FETs 18 and 20 have their drain and source, respectively, coupled to the terminal 14 of the load 12. The remaining terminal 16 of the load 12 is coupled to circuit ground. The FET 18 has its source coupled to a dc voltage supply (not shown) which produces an output voltage $V_{LOW}$ of between 0 and $-2$ volts. The FET 20 has its drain coupled to the cathode of a diode 22 whose anode is supplied with a dc voltage $V_{HIGH}$ of between 0 and 12 volts.

Four capacitors 24, 26, 28 and 30 are coupled in parallel between the source of the FET 18 and circuit ground. Four capacitors 32, 34, 36 and 38 are coupled in parallel between circuit ground and the junction anode of the diode 22 and the source supplying the voltage $V_{HIGH}$. The capacitors 24–30 and the capacitors 32–34 serve to shunt high-frequency transients away from the FETs 18 and 20, respectively. The benefit of coupling the four capacitors 24–30 in parallel is that the total inductance thereof is reduced, as compared to a single capacitor having the equivalent capacitance. The same advantage is achieved by coupling the capacitors 32–38 in parallel. Reducing the inductance within the driver circuit 10 helps to reduce the likelihood of spurious oscillations.

The FET 20 has its gate coupled to a first terminal of a capacitor 40. The second terminal of the capacitor 40 is coupled to the collector of an NPN bipolar junction transistor 42. A resistor 44 is coupled in series with a pair of diodes 46 and 47, connected in series-aiding fashion, between the source of the FET 20 and the collector of the transistor 42. The junction between the resistor 44 and the diode 46 is coupled to the first terminal of the capacitor 40. The resistor 44, the capacitor 40, and the pair of diodes 46 and 47 comprise a bias network 48 which, in accordance with the current flow therethrough, establishes the magnitude of the voltage across the source and gate terminals of the FET 20. While the voltage across the source and gate of the FET 20 is at or above 4.3 volts dc, the FET is substantially non-conductive.

The transistor 42 has its collector coupled via a resistor 49 to the emitter of an NPN bipolar junction transistor 50 whose collector is coupled to the anode of the diode 22. A resistor 51 couples the base of the transistor 50 to the junction of the drain and source of the FETs 18 and 20, respectively. The transistor 42 is supplied at the base thereof with an input voltage $V_{IN}$ through the series combination of a resistor 52 and a Zener diode 53. The Zener diode 53 is shunted by each of a pair of capacitors 54 and 56 which serve to pass high-frequency transients across the Zener diode. In practice, the Zener diode 53 has a breakdown voltage on the order of 13 volts. Thus, unless the voltage between the cathode and anode of the Zener diode 53 exceeds 13 volts, no current passes therethrough and into the base of the transistor 42.

The transistor 42 has its emitter coupled via a resistor 60 to one terminal 62 of a current source 64 having a second terminal 66 coupled to circuit ground. The current source 64 comprises an NPN bipolar junction transistor 68 whose collector forms the terminal 62 of the current source. The transistor 68 has its emitter coupled to ground via a resistor 70 connected in series with four capacitors 72–78 in parallel with each other. The junction between the capacitors 72–78 and circuit ground forms the terminal 66 of the current source 62. A voltage $V_B$ of approximately −22.5 volts dc is applied to the junction between the resistor 70 and the parallel combination of the capacitors 72–78.

The transistor 68 has its base coupled via a resistor 80 to a voltage source (not shown) which produces a voltage $V_A$ of approximately −12.5 volts dc. Four capacitors 82–88 are coupled in parallel between circuit ground and the junction of the resistor 80 and the voltage source supplying the voltage $V_A$. A pair of diodes 92 and 94 are coupled in series-aiding fashion with a resistor 96 between the base of the transistor 60 and the voltage source $V_B$ to establish the level of the voltage across the base-emitter junction thereof. In practice, the voltage appearing across the serial combination of the diodes 92 and 94 and the resistor 96 is positive because the voltage at the base of the transistor 60 (−12.5 volts) is more positive than the voltage at the emitter (−22.5 volts).

The terminal 62 of the current source 64 is coupled via a resistor 98 to the emitter of a transistor 100. The base of the transistor 100 is coupled via a resistor 102 to a voltage source (not shown) which supplies a voltage $V_{REF}$ of −10.5 volts dc. Four capacitors 104, 106, 108 and 110 are coupled in parallel between circuit ground and the junction between the resistor 102 and the voltage source supplying the voltage $V_{REF}$. The capacitors 104–110 serve to shunt high-frequency transients to circuit ground and away from the base of the transistor 100.

The transistor 100 has the collector thereof coupled via a capacitor 112 to the gate of the FET 18. Also, the collector of the transistor 100 is coupled by a resistor 114 to the source of the FET 18. The resistor 114 is shunted by the series combination of a resistor 116 and a diode 118. The junction between the resistor 116 and the diode 118 is coupled to the gate of the FET 18. The combination of the capacitor 112, the resistors 114 and 116, and the diode 118 forms a bias network 119 which, in accordance with the current passing therethrough, establishes the voltage between the source and gate of the FET 18. While the voltage between the source and the gate of the FET 18 remains at or above 4.3 volts, the FET remains substantially non-conductive.

The transistor 100 has its collector coupled to the collector of an NPN bipolar junction transistor 120. The emitter of the transistor 120 is coupled via a resistor 122 to the same voltage source which supplies the voltage $V_A$. Four capacitors 124, 126, 128 and 130 are coupled in parallel between circuit ground and the junction of the resistor 122 and the voltage source supplying the voltage $V_A$. The capacitors 124–130 serve to shunt high-frequency transients to circuit ground and away from the transistor 120.

The base of the transistor 120 is coupled via the serial combination of a resistor 132, a Zener diode 134 and a diode 135 to a voltage supply (not shown) which produces a dc voltage $V_{CONTROL}$ which may be adjusted between 0 and 5 volts. The cathode of the Zenner diode 134 is coupled by a resistor 136 to circuit ground. A pair of capacitors 138 and 140 each shunt the Zener diode 134 to conduct high-frequency transients across the Zener diode. In practice, the Zener diode 134 has a breakdown voltage of 11.0 volts. Unless the voltage at the cathode of the Zener diode 134 exceeds the sum of the breakdown voltage thereof (11 volts) and the forward voltage of the diode 135 (approximately 0.7 volts), no current will flow therethrough to the base of the transistor 120.

The operation of the driver circuit 10 will now be described assuming that $V_{IN}$ and $V_{CONTROL}$ are initially zero. When $V_{IN}$ is zero, the voltage at the base of the transistor 42 will be −13 volts, as measured with respect to circuit ground. In contrast, the base of the transistor 100 is on the order of −10.5 volts. The transistors 42 and 100 are coupled in differential fashion. Therefore, whichever one of the two transistors 42 and 100 has a more positive voltage at its base will conduct much more current than the other transistor. Hence, with $V_{IN}$ zero, the transistor 100 is much more conductive than the transistor 42.

When $V_{CONTROL}$ is zero, the voltage at the base of the transistor 120 will be on the order of −11.7 volts, which is the sum of the voltage across the Zener diode 134 and the diode 135. The voltage at the junction of the emitter of the transistor 120 and the first terminal of the resistor 122 will be on the order of −12.4 volts. The −12.4 volts represents the sum of the −11.7 volt drop across the diodes 134 and 135 and the voltage drop (typically −0.7 volts) across the base-emitter junction of the transistor. The voltage at the other terminal of the resistor 122 is −12.5 volts and thus, very little current passes through the resistor. Since very little current passes through the resistor 122, it follows that very little current passes into the collector of the transistor 120. Hence, when $V_{CONTROL}$ and $V_{IN}$ are zero, substantially all of the current produced by the current source 64 passes through the bias network 119 and through the transistor 100.

In practice, the current produced by the current source 64, and hence the current which passes through the transistor 100, is on the order of 100 ma. Typically, the capacitor 112, the resistors 114 and 116, and the diode 118 comprising the bias network 119 are selected such that the current passing therethrough is on the order of 100 ma, the voltage between the source and gate of the FET 18 will be at least 4.3 volts. As indicated earlier, when the voltage between the source and gate of the FET 18 is 4.3 volts or greater, the FET is substantially non-conductive. During the interval that the transistor 100 is very conductive, the transistor 42 passes only a very small current. Hence, the magnitude of the voltage appearing across the source and gate terminals of the FET 20 will be small, typically $<<4.3$ volts. As a result, the FET 20 becomes very conductive, causing the voltage at the terminal 14 of the load 12 to assume the value of $V_{HIGH}$. Under these conditions, current is sourced to the load 12.

When the voltage $V_{IN}$ rises from zero to 5 volts, the voltage at the base of the transistor 42 rises from approximately $-13$ volts to approximately $-8$ volts. The voltage at the base of the transistor 42 now is more positive than the voltage at the base of the transistor 100. Hence the transistor 42 becomes much more conductive than the transistor 100 and now serves to pass substantially all of the current produced by the current source 64, thereby diverting the current away from the bias network 119. The capacitor 40, the resistor 44 and the diodes 46 and 47 which comprise the bias network 48 are selected such that when the current therethrough is 100 ma, a voltage of at least 4.3 volts appears between the gate and source of the FET 20 to render the FET substantially non-conductive. In contrast, with the transistor 42 now very conductive, little current passes into the transistor 100 and only a very small voltage appears between the source and gate of the FET 18. The FET 18 now becomes conductive so the voltage at the terminal 14 of the load 12 approaches the value of $V_{LOW}$. Under these conditions, current will be sunk from the load 12.

If the amplitude of the voltage $V_{IN}$ is made to alternate between 0 and 5 volts, then the FETs 18 and 20 will be alternately rendered very conductive. The frequency at which the voltage $V_{IN}$ alternates between 0 and 5 volts controls the frequency at which the FETs 18 and 20 are alternately rendered very conductive. To enhance the transient response, that is, the switching speed, of the transistors 42 and 100, it is desirable that the current passing into the collector of each transistor never approach zero. In contrast, it is desirable that the voltage between the source and gate of each of the FETs 18 and 20 be made to approach zero when each is to be rendered conductive to assure that the resistance thereof is small (less than 1 ohm). These apparently conflicting conditions are simultaneously satisfied because of the presence in the bias network 48 of the combination of the capacitor 40 and the diodes 46 and 47, and the presence of the combination of the capacitor 112 and the diode 118 in the bias network 119. While the transistor 42 is very conductive, the capacitor 40 charges through the diodes 46 and 47. However, as the current passing into the collector of the transistor 42 declines so that voltage at the collector thereof drops to $-1.4$ volts, then the capacitor 40 discharges into the gate of the FET 20 so that voltage across the gate and source is maintained approximately at zero volts. The discharge of the capacitor 40 into the gate of the FET 20 causes a small current (e.g., 10 ma) to pass through the transistor 50 and the resistor 49. Similarly, the capacitor 112 will discharge into the gate of the FET 18 once the voltage at the collector of the transistor 100 rises above $-0.7$ volts to maintain a small current flow into that transistor. The small current flow in each of the transistors 42 and 100 prevents each transistor from becoming cut off.

Both of the FETs 18 and 20 will be rendered substantially non-conductive when the magnitude of both $V_{IN}$ and $V_{CONTROL}$ is 5 volts. When $V_{CONTROL}$ is 5 volts, the voltage at the base of the transistor 120 rises to $-6.7$ volts. The voltage across the resistor 122 will now be on the order of 5 volts so that the current therethrough will be on the order of 100 ma. If the current through the resistor 122 is 100 ma, then the current passing into the collector of the transistor from the bias network 119 must be 100 ma, thereby causing the voltage across the source and gate of the FET 18 to be at least 4.3 volts. As a result, the FET 18, which heretofore was conductive, now becomes substantially non-conductive.

To maintain FET 20 substantially non-conductive while the FET 18 is substantially non-conductive, the load 12 would ordinarily have to sink the current supplied by the current source 64 to keep the voltage drop across the bias network 48 above 4.3 volts. However, while both the FETs 18 and 20 are substantially non-conductive, it is desirable to present a high impedance to the load terminal 14. During the interval that the FET 20 is substantially non-conductive, enough current still passes therethrough to enable the transistor 50 to become conductive. Once rendered conductive, the transistor 50 provides a low resistance current path between the anode of diode 22 and the collector of the transistor 42 so that a substantial portion of the current provided by the current source 64 passes therethrough from the voltage source supplying the voltage $V_{HIGH}$.

Exemplary values for each of the components comprising the driver circuit 10 are listed below in Table I.

TABLE I

| | |
|---|---|
| FETs 18 and 20 | MA4f200-818 (MA COM ASO Inc., Boston, MA) |
| Transistors 42, 50, 68, 100 and 120 | MSC 80460 Microwave Semiconductor Corp. Somerville, NJ |
| Diodes 22, 46, 92, 94, 118 and 135 | 1N4148 Motorola Inc. Schaumburg, IL |
| Zener Diode 53 | 1N5243 Motorola Inc. |
| Zener Diode 134 | 1N5241 Motorola Inc. |
| Capacitors 24, 32, 78, 104 and 124 | 27 pf. |
| Capacitors 26, 34, 76, 106 and 126 | 10 nf. |
| Capacitors 28, 36, 74, 108 and 128 | 0.1 uf. |
| Capacitors 30, 38, 72, 110 and 130 | 2 uf. |
| Capacitors 40 and 112 | 200 pf. |
| Capacitors 54 and 140 | 10 nf. |
| Capacitors 56 and 138 | 50 nf. |
| Resistors 44 and 116 | 1500 ohms |
| Resistors 49, 58, 70, 114 and 138 | 50 ohms |
| Resistors 51, 52, 102 and 132 | 100 ohms |
| Resistors 60 and 98 | 20 ohms |
| Resistors 80 and 96 | 43 ohms |

It is to be understood that the embodiments described herein are merely illustrative of the principles of the invention. Various modifications and changes may be made thereto by persons skilled in the art which will embody the principles of the invention and fall within the spirit and scope thereof.

What is claimed is:

1. A method of sinking current from, and sourcing current to a load comprising the steps of:

supplying a current from a current source to a first bias network to cause a first voltage of a predetermined magnitude to appear thereacross;

applying the first voltage between a gate and source of a first high-frequency field effect transistor coupled between one of a pair of voltage sources which serve to sink and source current, respectively, and the load, the first field effect transistor being substantially non-conductive during the intervals while the first voltage remains above the predetermined magnitude;

diverting substantially all of the current supplied by the current source away from the first bias network and into a second bias network at selected intervals so that a second voltage of a predetermined magnitude appears thereacross while the first voltage appearing across the first bias network drops below the predetermined magnitude, thereby causing the first field effect transistor to become conductive; and applying the second voltage developed between a gate and source of a second field effect transistor coupled between the load and the other of the pair of voltage sources, the second field effect transistor remaining substantially non-conductive only during intervals while the second voltage remains above the predetermined magnitude which occurs only while current is present in the second bias network.

2. The method according to claim 1 wherein the current from the current source is periodically diverted away from the first bias network and into the second bias network to periodically render the first and second field effect transistors alternately conductive.

3. The method according to claim 1 wherein current from a second current source is supplied to the second bias network during the intervals that current is supplied to the first bias network so that both the first and second field effect transistors are rendered substantially non-conductive.

4. The method according to claim 1 wherein:
the step of supplying current to the first bias network comprises the step of rendering conductive a first junction transistor coupled between the current source and the first bias network to provide a current path therebetween; and
the step of diverting current into the second bias network comprises the steps of rendering the first junction transistor substantially non-conductive and rendering conductive a second junction transistor coupled between the second bias network and the current source to provide a current path therebetween, the second junction transistor being rendered substantially non-conductive during intervals the first junction transistor is conductive.

5. The method according to claim 4 further including the steps of:
storing electrical energy in each of the first and second bias networks during intervals when the first and second junction transistors are conductive, respectively; and
discharging the stored electrical energy in the first and second bias networks into the gate of each of the first and second field effect transistors, respectively, and through each of the first and second junction transistors, respectively, as each junction transistor is rendered substantially non-conductive to prevent operation thereof in the cutoff region.

6. A method of alternately sinking current from and sourcing current to a load comprising the steps of:
supplying a current from a current source to a first bias network to cause a voltage of a predetermined magnitude to appear thereacross;
applying the voltage developed across the first bias network to a gate of a first high-frequency field effect transistor coupled between one of a pair of voltage sources which serve to sink and source current, respectively, and the load to maintain the field effect transistor substantially non-conductive during the intervals while the voltage applied to the gate thereof remains at or above the predetermined magnitude;
periodically diverting substantially all of the current supplied by the source away from the first bias network and into a second bias network thereby so that a voltage of a predetermined magnitude periodically appears thereacross while at the same time substantially no voltage appears across the first bias network, thereby causing the first field effect transistor to become conductive; and
applying the voltage periodically developed across the second bias network to a gate of a second field effect transistor coupled between the load and the other of the pair of voltage sources to maintain the second field effect transistor non-conductive during intervals while the first field effect transistor is conductive.

7. The method according to claim 6 wherein:
said step of supplying current to the first bias network comprises the step of rendering conductive a first junction transistor coupled between the current source and the first bias network to provide a current path therebetween; and
said step of periodically diverting current into the second bias network comprises the steps of periodically rendering the first junction transistor substantially non-conductive and rendering conductive a second junction transistor coupled between the second bias network and the current source to provide a current path therebetween, the second junction transistor being rendered substantially non-conductive during intervals the first junction transistor is conductive.

8. The method according to claim 7 further including the steps of:
storing electrical energy in each of the first and second bias networks during intervals when the first and second junction transistors are conductive; and
discharging the stored electrical energy in the first and second bias networks into the gate of each of the first and second field effect transistors, respectively, and through each of the first and second junction transistors, respectively, as each junction transistor is rendered substantially non-conductive to prevent operation thereof in the cutoff region.

9. Apparatus for sinking current from, and sourcing current to, a load comprising:
a first field effect transistor having its source-to-drain portion coupled between the load and one of a pair of voltage sources which serve to sink and source current, respectively;
a second field effect transistor having its source-to-drain portion coupled between the load and the other of the pair of voltage sources;
a first bias network coupled between the gate and source of the first field effect transistor;

a second bias network coupled between the gate and source of the second field effect transistor;

means for supplying a current to the first bias network so that the voltage developed thereacross is of a sufficient magnitude to render the first field effect transistor non-conductive; and means for diverting substantially all of the current from the first bias network so that the voltage developed thereacross is insufficient to render the first field effect transistor substantially non-conductive and causing the current to pass into the second bias network at selected intervals so that a voltage is developed thereacross which is of a sufficient magnitude to render the second field effect transistor non-conductive.

10. The apparatus according to claim 9 further including means for supplying current to the second bias network during intervals when the first bias network is supplied with current so that both of the first and second field effect transistors are rendered non-conductive.

11. The apparatus according to claim 10 wherein the means for supplying current to the first bias network comprises:

a source of current; and a bipolar junction transistor having its collector-to-emitter coupled between the current source and the first bias network for providing a current path therebetween during intervals the bipolar junction transistor is rendered conductive.

12. The apparatus according to claim 11 wherein the diverting means comprises:

a second bipolar transistor coupled between the source of current and the second bias network for providing a current path therebetween so as to divert current from the first bias network while the first bipolar transistor is substantially non-conductive.

13. The apparatus according to claim 9, characterized in that each of said first and second bias networks each includes energy storage means for storing electrical energy therein when a separate one of said first and second junction transistors is conductive, respectively, and for discharging the stored energy into the gate of a separate one of said first and second field effect transistors, respectively, and through a separate one of the first and second junction transistors, respectively, as each junction transistor is rendered substantially non-conductive to prevent the operation thereof in the cutoff region.

14. An electrical circuit for alternately sourcing current to, and sinking current from, a load comprising:

a first field effect transistor having its source-to-drain portion coupled between the load and one of a pair of voltage sources which source and sink current, respectively;

a second field effect transistor having its source-to-drain coupled between the load and the other of the pair of voltage sources;

a first bias network, including energy storage means, coupled to the gate and source of the first field effect transistor;

a source of current;

a first junction transistor coupled between the source of current and the first bias network for providing a current path therebetween;

a second bias network, including energy storage means, coupled to the gate and source of the second field effect transistor; and a second junction transistor coupled between the current source and the second bias network for providing a current path therebetween.

15. The circuit according to claim 14 further including a second current source for selectively supplying current to the second bias network.

* * * * *